United States Patent [19]

Kronmüller et al.

[11] Patent Number: 4,737,658
[45] Date of Patent: Apr. 12, 1988

[54] CENTRALIZED CONTROL RECEIVER

[75] Inventors: Heinz Kronmüller, Karlsruhe; Joachim Stöckle, Stutensee-Büchig; Jörg Pühler, Karlsruhe, all of Fed. Rep. of Germany

[73] Assignee: Brown, Boveri & CIE AG, Mannheim-Käfertal, Fed. Rep. of Germany

[21] Appl. No.: 893,097

[22] Filed: Aug. 4, 1986

[30] Foreign Application Priority Data

Aug. 5, 1985 [DE] Fed. Rep. of Germany ....... 3528046

[51] Int. Cl.$^4$ .............................................. G06F 15/34
[52] U.S. Cl. .................................... 307/105; 307/351; 364/724; 455/216; 324/102
[58] Field of Search ............... 307/105, 351, 352, 353, 307/350; 455/307, 213, 216, 339, 234; 364/724; 375/76, 96, 103; 328/165, 166, 167; 340/310 R, 310 A, 825.06, 825.13

[56] References Cited

U.S. PATENT DOCUMENTS

| 3,629,509 | 12/1971 | Glaser | 364/724 X |
|---|---|---|---|
| 3,639,739 | 2/1972 | Golden et al. | 364/724 |
| 3,889,108 | 6/1975 | Cantrell | 364/724 |
| 4,007,360 | 2/1977 | Kniel et al. | 364/724 |
| 4,099,245 | 7/1978 | Maysonett | 364/724 X |
| 4,101,964 | 7/1978 | Betts | 364/724 |
| 4,250,456 | 2/1981 | Shinmyo et al. | 455/216 X |
| 4,340,875 | 7/1982 | English | 364/724 X |
| 4,344,149 | 8/1982 | Meeberg et al. | 364/724 |
| 4,500,837 | 2/1985 | Shuey et al. | 328/105 X |
| 4,554,633 | 11/1985 | Glover et al. | 364/724 X |
| 4,588,979 | 5/1986 | Adams | 364/724 X |
| 4,633,426 | 12/1986 | Venier | 364/724 |
| 4,652,857 | 3/1987 | Meiksin | 307/351 X |

OTHER PUBLICATIONS

LSI Module for the Implements of Digital Filters IEE Proc., vol. 128 Nov. 1981.
Programable Digital Filter Performs Multiple Functions Electronics Oct. 26, 1970.

Primary Examiner—William M. Shoop, Jr.
Assistant Examiner—Paul Ip
Attorney, Agent, or Firm—Herbert L. Lerner; Laurence A. Greenberg

[57] ABSTRACT

Centralized control receiver for power distribution networks, includes an input section containing at least one digital filter, an evaluating device, and an output section, the digital filter having a frequency response effecting selective damping of harmonic frequencies of at least one of the frequency of a respective network and control frequencies of at least one of adjacent centralized control services and of network-specific interference frequency ranges.

12 Claims, 3 Drawing Sheets

CENTRALIZED CONTROL RECEIVER

The invention relates to a centralized control receiver and, more particularly, to a centralized control receiver for power distribution networks which includes an input section containing at least one digital filter, and evaluating device, and an output section. Centralized control receivers have been used for decades in power supply networks for the control of loads. The centralized control technology operates with coded sound frequency signals transmitted in telegram form and superposed to the power supply network (e.g. 50 Hz or 60 Hz). Centralized control systems have been introduced into the networks of the power supply companies which differ in the choice of the sound frequency or other system characteristics e.g. the pulse raster. It is the operative function of the centralized control receiver to detect pulse telegrams transmitted over the power supply network and, if necessary or desirable, execute certain switching functions. To perform this operative function, a centralized control receiver is provided with an input section to filter and form the received pulses, a processing section to evaluate pulse telegrams and an output section with switching equipment.

The detection job of the centralized control receiver is rendered more difficult by the presence of interference variables in the received signal or network signal. Interference variables primarily include harmonics of the line frequency (line harmonics), but also the line frequency itself. The line voltage fluctuates in frequency and amplitude within a tolerance range; this is true also for the line harmonics, correspondingly. Other interferences are control frequencies of nearby power supply companies and other uncontrolled interferences noticeable as sound.

These interference variables are the reasons why sound frequency pulse receiption level at the centralized control receiver input must not drop below a given minimum. Conventional centralized control receivers with an analog band filter in the input section are constructed for a minimum sound frequency function voltage of about 0.5% of line voltage. To ensure such an input voltage, high capacity centralized control transmitters are required. If it were possible, then to lower the required transmission level, considerable economic advantages would result. However, a marked reduction in the minimum transmission level can not be achieved any more with analog band filters. Moreover, analog filters have several production-engineering disadvantages because they contain frequency-determining components which must be tuned.

Another important variable is the selectivity of the band filter. The present-day frequency plan (VDEW plan) for centralized control frequencies is determined by the selectivity attainable heretofore. With analog filters, it is not possible at economically justifyable costs to make any significant progress with respect to selectivity either.

It is suggested in German Pat. No. 27 08 074 to provide a one-chip microcomputer which is used also for digital filtering-out of the centralized control pulses. This achieves the goal of reducing the hardware costs for a centralized control receiver by more integration. However, the suggested digital filter is supposed merely to simulate the functions of an analog filter. Any indications that better filter characteristics can be obtained with a digital filter and how this could be accomplished cannot be found in the foregoing German patent.

Starting from the German Published Prosecuted Application (DE-AS) No. 27 08 074, it is an object of the invention to provide a centralized control receiver with a digital filter for filtering centralized control pulses out of a network signal which avoids the disadvantages of heretofore known filters and which has, in particular, great selectivity at high input sensitivity.

With the foregoing and other objects in view, there is provided, in accordance with the invention, a centralized control receiver for power distribution networks, which includes an input section containing at least one digital filter, an evaluating device, and an output section, the digital filter having a frequency response effecting selective damping of harmonic frequencies of at least one of the frequency of a respective network and control frequencies of at least one of adjacent centralized control services and of network-specific interference frequency ranges.

In accordance with another feature of the invention, the digital filter is an FIR—or Finite Impulse Response-matched filter of Nth order having a construction based on specific channel characteristics of the respective power distribution network with the interference variables inherent therein including the line frequency and the harmonics thereof taking line frequency fluctuations into account, frequencies of adjacent centralized control services and interference spectra dependent upon the network area.

In accordance with a further feature of the invention, the frequency response of the filter has zero points indicating infinite attenuation for frequencies which correspond to the harmonic frequencies of the line frequency and to control frequencies of adjacent centralized control services.

In accordance with an additional feature of the invention, the digital filter is a band pass with an impulse response $$g(k) = \begin{cases} c \sin(\omega_o kT + \phi), & 0 \leq k \leq N-1 \\ 0 & \text{otherwise} \end{cases}$$

in which
g (k)=impulse response or filter coefficient
c=constant
$\omega_o = 2\pi f_o$, $f_o$=centralized control frequency
$T = 1/f_s$, $f_s$=sampling frequency
k=1, 2, 3
$\phi$=phase shift
N=filter order.

In accordance with an added feature of the invention, the input section contains two of the digital filters connected in series and having the following impulse response:

$$g(k) = \begin{cases} c \sin(\omega_o kT + \phi), & 0 \leq k \leq N-1 \\ 0 & \text{otherwise} \end{cases}$$

in which
g (k)=impulse response or filter coefficient
c=constant
$\omega_o = 2\pi f_o$, $f_o$=centralized control frequency
$T = 1/f_s$, $f_s$=sampling frequency k=0, 1, 2, 3
φ=phase shift
N=filter order.

In accordance with yet another feature of the invention, there is provided a phase-synchronized control loop or PLL circuit coupling the sampling frequency $f_s$ of the digital filter to the line frequency $f_N$.

In accordance with yet a further feature of the invention, the sampling frequency $f_s$, the constant c, and the phase shift φ are selected so that the resultant filter coefficient g(k) is −1, 0 , or 1 only.

In accordance with yet an additional feature of the invention, the filter order N is selected so that zero points result in the frequency response at intervals $\Delta f$=line frequency $f_N/m$ wherein m is 1, 2, 3, . . . , and the sampling frequency $f_s$ is an integral multiple of the line frequency $f_N$.

In accordance with yet an added feature of the invention, the filter constitutes a recursive filter structure.

It is suggested, in accordance with the invention, to provide an input filter with a special frequency response, namely with a selective, high damping of individual frequencies or small frequency ranges. Such a filter has an advantageously short response time and, at any rate, a sufficiently short response time. It can be constructed in various ways, as noted hereinabove.

When constructed as an FIR-matched filter of the $N^{th}$ order, it is a filter which is hereinafter referred to as optimal filter and, advantageously, has predetermined frequency ranges of high attenuation. Any interference frequencies (e.g. extraneous centralized control frequencies) and interfering frequency ranges (e.g. interferences caused by power converters in locally limited network parts), respectively, can be suppressed. The centralized control frequency can be selected arbitrarily, and therefore does not have to be in a specific raster. Furthermore, the sampling frequency is fixed and therefore independent of the centralized control frequency and the line frequency. This means that no PLL circuit is needed to assure suppression of the line frequency and its harmonics, even at fluctuating line frequency. The filter itself, however, at present is still relatively expensive. This hardware expense may quickly lose in importance, however, as technical development progresses.

With a filter designated suboptimal, the desired filter characteristics are attainable in a different way at lower hardware expense, namely by zeroing the frequency response in a selectable raster of e.g. 25 Hz, 16 and ⅔ Hz, 8 and ⅓ Hz or 4 and 1/6 Hz, thereby suppressing both line harmonics and centralized control frequencies of other power distribution companies in the selected raster. Thus, there is no mutual interfences of adjacent or neighboring power distribution companies using different control frequencies corresponding to a multiple of the selected raster frequency. This means also that sound frequency barriers and trap circuits in common use today in the power supply networks can be dispensed with or eliminated after the introduction of the receiver according to the invention. In addition, control frequencies can be used which could not be used before because of closely adjacent line frequency harmonics. And finally, one very important advantage is that minimal input levels of about 0.1 to 0.3% of the line voltage are sufficient for the centralized control frequency.

By suitably selecting the filter coefficients it is possible to keep the realization expense for the suboptimal digital filter low. For this purpose, filter coefficients composed of powers of the number 2 are taken into consideration. This possibility is known from E. Lüder, "Design and Optimization of Digital Filters without Multipliers", AEÜ, Vol. 37 (1983), No. 9/10, pages 299 to 302, in particular page 299, Equation (3). According to one advantageous embodiment of the invention of the instant application, it is suggested that a transfer function with parameters selected so that the filter coefficients assume the values −1, 0, or 1 only, be taken as a basis. Only additions and subtractions are required therewith for the realization of the filter, whereby the computing process is greatly simplified. Of advantage is also the possibility of using a recursive filter structure for the realization of the filter.

Advantageously, coupling of the sampling frequency to the line frequency can be accomplished by means of a PLL circuit. This prevents the filter characteristics from varying with variations of the line frequency.

Other features which are considered as characteristic for the invention are set forth in the appended claims.

Although the invention is illustrated and described herein as embodied in centralized control receiver, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing, in which.

Figure 1:
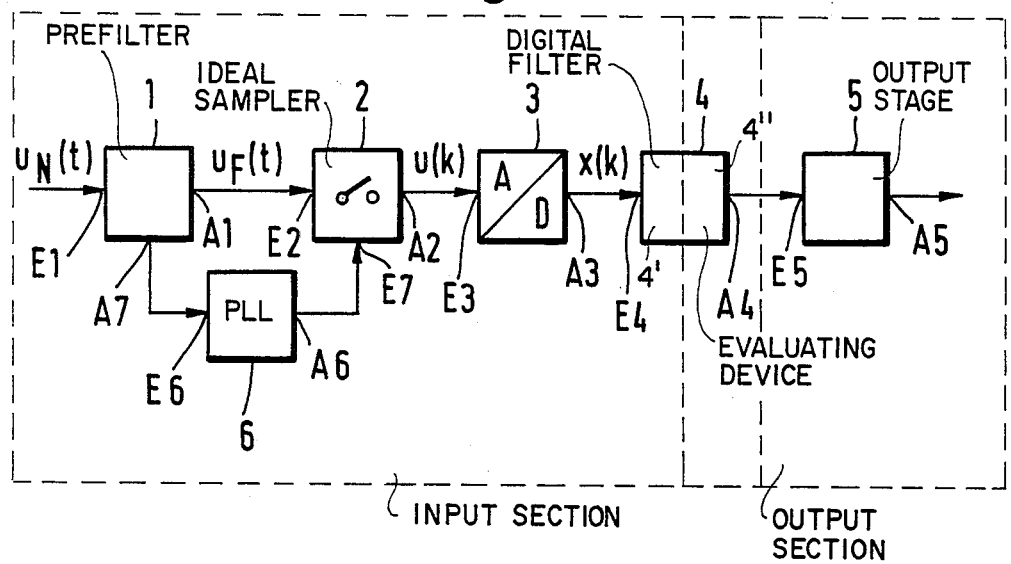
FIG. 1 is a block diagram of a centralized control receiver according to the invention.

Reffering now to the drawing and first, particularly to FIG. 1 thereof, there is shown a block diagram of a centralized control receiver according to the invention. The centralized control receiver contains a prefilter 1, an ideal sampler 2, an A/D converter 3, a digital processing unit 4, and an output stage 5 all of which are series-connected. In the case of the suboptimal filter, a PLL circuit 6 may be provided having an input E6 which is connected to a second output A7 of the prefilter 1 and having an output A6 which is connected to a second input E7 of the sampler 2. The digital processing unit 4 performs both the function of a band filter for digitally filtering the centralized control pulses out of the network signal, as well as the function of an evaluator. Thus, the input section of the centralized control receiver is formed of the components made up of the prefilter 1, the sampler 2, the A/D converter 3 and the band filter in the processing unit 4.

The PLL circuit 6 provided in the case of the suboptimal filter is not absolutely necessary, but it ensures a particularly low transmitting and receiving level for the centralized control frequency. By coupling the sampling frequency of the sampler 2 to the network frequency, assurance is provided that the network harmonics will be highly attenuated even in the event of variations of the network frequency. An anti-aliasing filter can be dispensed with.

If a PLL circuit as shown in FIG. 1 is used, the prefilter 1 is formed of a Butterworth high-pass of the fourth order with a cut-off frequency $f_g=150$ Hz for the selective attenuation of the network frequency level, and of a low-pass of the first order with a cut-off frequency $f_g=350$ Hz. The high-pass lowers the line frequency level to the range of the other signal components and, in addition, matches the line signal level to a voltage range acceptable for the succeeding electronic devices. The low-pass attenuates high-frequency interferences, such as are caused by switching processes, for example, and also noise levels. The output of the low-pass is connected to the output A7 of the prefilter, to which the PLL circuit 6 is connected.

If a PLL circuit is dispensed with, i.e. if the sampling frequency is fixed, it is expedient to use in the prefilter 1 a low-pass of the sixth order with a cut-off frequency $f_g=350$ Hz instead of the simple low-pass of the first order. The low-pass of the sixth order acts as an anti-aliasing filter, thus counteracting a falsification of the analog spectrum by the subsequent sampling.

The line signal $u_N(t)$ is fed to an input E1 of the prefilter 1. A prefilter output A1 furnishes to an input E2 of the ideal sampler 2 a prefiltered and level-matched signal $u_F(t)$. By equidistant sampling with a sampling time T, the ideal sampler 2 forms a discrete sequence of values u(k) from the continuous signal $u_F$. The adjoining A/D converter effects an amplitude quantization of this sequence u(k) and furnishes at its output A3 a sequence of values which is fed as an input sequence x(k) to an input E4 of the digital processing unit 4.

With the digital processing unit 4, a digital band filter 4' as well as an evaluating device 4" to decode the received centralized control pulses is realized. Decoding of centralized control pulses as well as the construction of the output stage 5 are known and need no detailed explanation. Therefore, what follows relates to the conception of the digital band filter.

Figure 2:
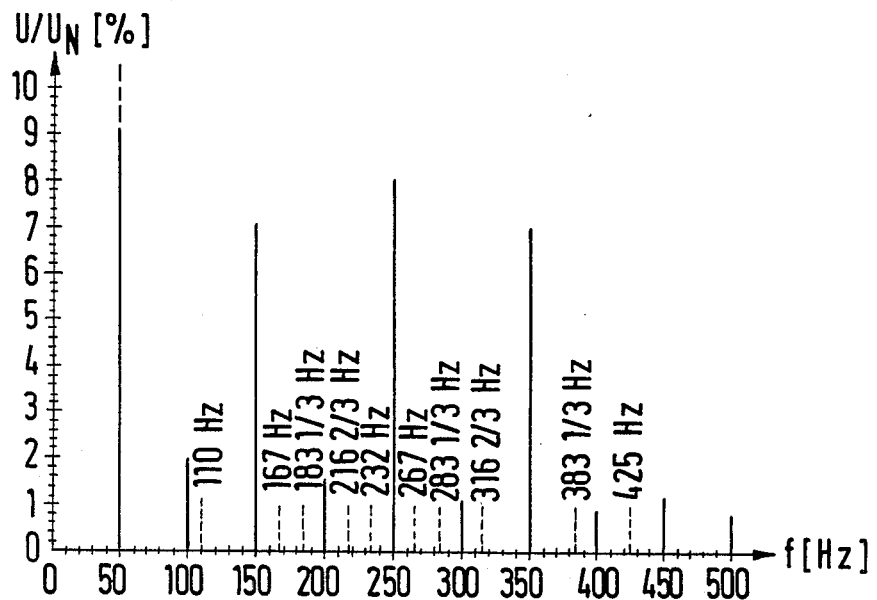
FIG. 2 is a plot diagram showing typical levels for network harmonics per VDE 0420 as well as centralized control frequencies per VDEW.

In conceiving the band filter, one starts from a conventional or predetermined frequency spectrum shown in FIG. 2 by way of example. FIG. 2 shows levels U in percentages of the line voltage $U_N$ for line harmonics per VDE 0420 (unbroken i.e. solid lines) and control frequencies of centralized control systems (broken or dotted lines), centralized control frequencies per VDEW being shown with a level of 1% of the line voltage. In order to obtain a finite response time, an optimal filter has to have a high damping value only in the narrow range of the interfering line harmonics and extraneous centralized control frequencies. In the intermediate frequency ranges less attenuation suffices to suppress noise or other interferences in the network. The line harmonics should not be considered to be spectral lines, but rather, narrow frequency ranges, because the line frequency moves within a permissible tolerance range of e.g. 49 to 50.5 Hz, so that the line harmonics are also not constant. In addition, the centralized control frequencies also have a tolerance range.

Figure 3:
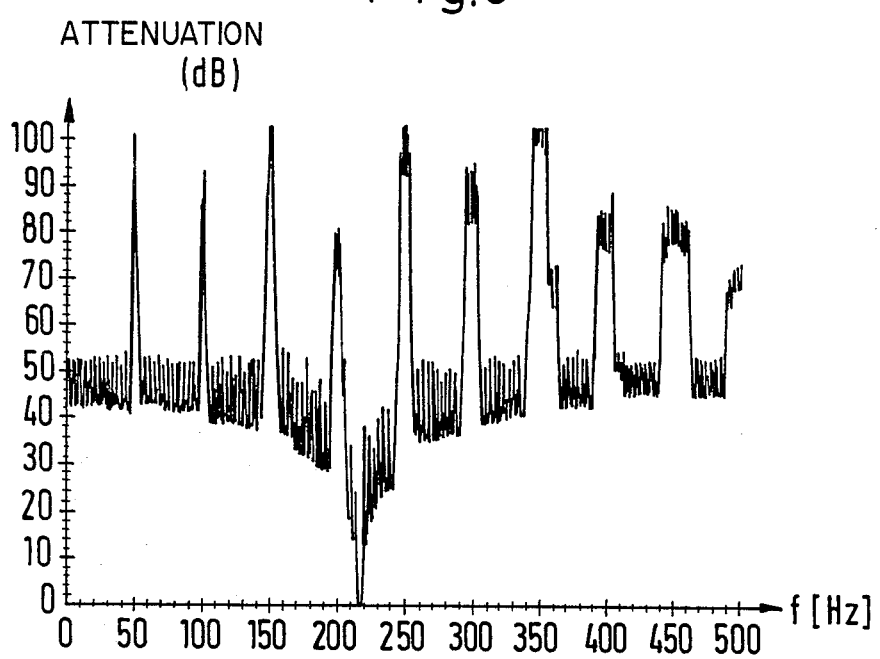
FIG. 3 is a plot diagram of a loss or attenuated curve of an optimal digital filter.

The attenuation curve of a filter considered to be optimal and furnishing at its output a maximum power ratio between usable and interference signal (matched filter) under the given conditions is shown in FIG. 3, by way of example. Extraneous centralized control frequencies have not been taken into account, however, in the example shown. Such a filter would not be realizable as an analog filter. Also constructing it as a digital filter requires a given hardware expenditure because a high filter order and, hence, a great number of multiplications and additions per sampling period is required. In such an optimal filter, however, an input level for the centralized control frequency of about 0.1% of the line voltage may suffice, in fact, in the entire tolerance range of the line voltage and its harmonics. The input level which is required depends upon the specified bit error probability.

According to one advantageous embodiment, a proposal is made to provide a so-called suboptimal filter which permits an approximately equally low input level and is easier to realize. One starts from a digital band filter with the impulse response $$g(k) = \begin{cases} c \sin(\omega_0 kT + \phi) & 0 \leq k \leq N-1 \\ 0 & \text{otherwise} \end{cases}$$

in which
g (k)=pulse reply or filter coefficient
c=constant
$\omega_0=2\pi f_0$, $f_o$=centralized control frequency
$T=1/f_s$, $f_s$=sampling frequency
k=0, 1, 2, 3
$\phi$=phase shift
N=filter order.

The parameters c, T and $\phi$ have been selected so that simple filter coefficients g(k) result, namely $-1$, 0, or 1 only. The following applies to the relationship between input sequence x(k) and output quantity y(k) of the filter:

$$y(k) = \sum_{i=o}^{N-1} g(i) \times (k-i).$$

With the simple filter coefficient $g(k)=-1$, 0, or 1, only additions and subtractions are required for the realization of the filter.

Figure 5:
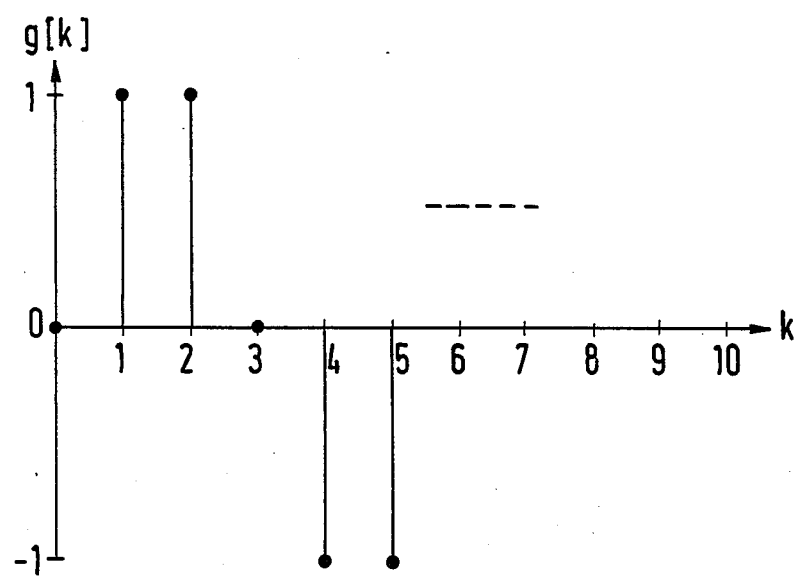
FIG. 5 is a plot diagram of advantageous filter coefficients g(k).

By selecting, for example, the parameters: sampling frequency $f_s=6\ f_0$; constant $c=2/\sqrt{3}$; and phase shift $\phi=0°$, the result will be the filter coefficients $g(k)=0, 1, 1, 0, -1, -1, \ldots$ as shown in FIG. 5.

Another beneficial characteristic of the suggested suboptimal filter type is the possibility of using a recursive filter structure for the realization of the filter. This makes a further reduction in expense possible. If the filter coefficients $g(k)=0, 1, 1, 0, -1, -1 \ldots$, the equation of differences obtained reads $$y(k)=y(k-1)-y(k-2)+x(k-1)-x(k-N-1).$$

For computing the output quantity y(k), only two subtractions and one addition are required, regardless of the filter order N.

The described filter suppresses certain frequencies $f_k$ completely by zeroing in the amplitude characteristic. The following applies to the frequencies:

$$f_k = \frac{K}{N} f_s$$

$$k = 0, 1, \ldots, /N - 1$$

$$k \neq \frac{N}{6}, \frac{5}{6} N$$

The filter characteristic is utilized to eliminate the line frequency and its harmonics. This is effected by suitably selecting the sampling frequency $f_s$ and the filter order N.

For a typical centralized control frequency $f_o = 216$ and $\frac{2}{3}$ Hz, the scanning frequency $f_s$ will be $f_s = 6 f_o = 1300$ Hz.

Suppression of the line frequency $f_N = 50$ Hz including all harmonics takes place at the filter orders: $N = 78, 156, 234, 312, 390, \ldots$ At these filter orders N complete suppression of extraneous control frequencies in the 16 and $\frac{2}{3}$ Hz raster additionally occurs. It is easy to see that, by the appropriate selection of parameters, a suppression of control frequencies in another raster, e.g. in an 8 and $\frac{1}{3}$ Hz or 4 and 1/6 Hz raster, can also be achieved.

Figure 4:
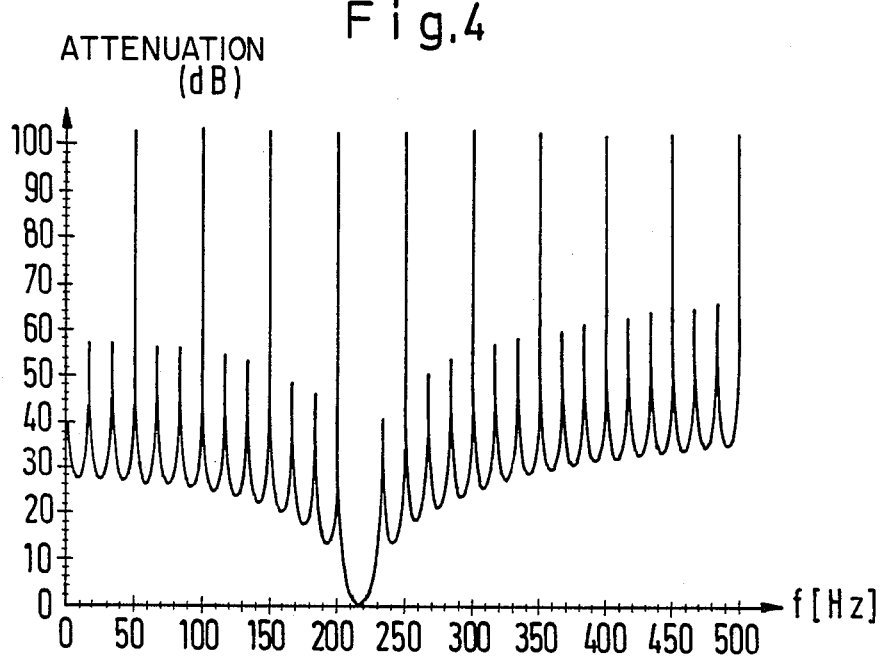
FIG. 4 is a plot diagram of a loss or attenuated curve of a suboptimal digital filter.

FIG. 4 shows the loss or attenuation curve of a suboptimal filter in the case of the filter order $N = 78$. Such a filter has a short response time (60 ms approx.).

By connecting two or more filters in series, an even greater variability with respect to the loss or attenuation curve is obtained, and the results in the event of frequency deviations are about as favorable as when using a PLL circuit.

Extensive test series with an optimal and with a suboptimal digital filter have been run in a power distribution company network (EVU), which practically confirmed the theoretically expected results. They have also demonstrated that the suggested suboptimal filter can be realized for centralized control receivers e.g. with an 8 bit microprocessor of the Intel 8085 type, and that centralized control receivers equipped with it have about the same favorable characteristics as centralized control receivers with an optimal filter.

The foregoing is a description corresponding, in substance, to German application No. P 35 28 046.8, dated Aug. 5, 1985, International priority of which is being claimed for the instant application, and which is hereby made part of this application. Any material discrepancies between the foregoing specification and the specification of the aforementioned corresponding German application are to be resolved in favor of the latter.

There is claimed:

1. Centralized control receiver for power distribution networks comprising:
    an input section, having a prefilter for receiving the input signal for selectively attenuating the network frequency signal level; a sampler connected to the pre-filter for sampling the filtered signal; an analog/digital converter connected to the sampler for digitizing the samples; and a digital filter connected to the analog/digital converter having a band-pass filter characteristic providing a given attenuation outside the pass band;
    an evaluation device connected to the digital filter for decoding the digital filter output signals into control impulses;
    an output section; and
    wherein said digital filter has a plurality of zero points with infinite attenuation, includes selective attenuating means for selectively highly attenuating the harmonic frequencies of at least one of: the respective network, the control frequencies of adjacent centralized control services and network-specific noise frequency bands.

2. Centralized control receiver according to claim 1, wherein said digital filter selective attenuating means include a Finite Impulse Response-matched filter of Nth order having filter orders selected for matching the specific channel characteristics of the respective power distribution network, and means for rejecting the interference variables inherent in the channel including the line frequency and the harmonics thereof taking line frequency fluctuations into account, frequencies of adjacent centralized control services and interference spectra dependent upon the network area.

3. Centralized control receiver according to claim 1, wherein said selective attenuating means include further filter means for providing a filter response having zero points indicating infinite attenuation for frequencies which correspond to the harmonic frequencies of the line frequency, and still further filter means for attenuating the frequencies of adjacent centralized control services.

4. Centralized control receiver according to claim 3, wherein said further filter means include a band pass having an impulse response $$g(k) = \begin{cases} c[x] \sin(\omega_o kT + \phi), & 0 \leq k \leq N-1 \\ 0 & \text{otherwise} \end{cases}$$

in which
g (k) = impulse response coefficient
c = constant
$\omega_o = 2\pi f_o$, $f_o$ = centralized control frequency
$T = 1/f_s$, $f_s$ = sampling frequency
k = 0, 1, 2, 3
$\phi$ = phase shift
N = filter order
$f_N$ = line frequency.

5. Centralized control receiver according to claim 3, wherein said input section contains two of said digital filters connected in series and having the following impulse response:

$$g(k) = \begin{cases} c[x] \sin(\omega_o kT + \phi), & 0 \leq k \leq N-1 \\ 0 & \text{otherwise} \end{cases}$$

in which
g (k) = impulse response coefficient
c = constant
$\omega_o = 2\pi f_o$, $f_o$ = centralized control frequency
$T = 1/f_s$, $f_s$ = sampling frequency
k = 0, 1, 2, 3
$\phi$ = phase shift
N = filter order
$f_N$ = line frequency.

6. Centralized control receiver according to claim 4, including a phase-synchronized PLL circuit coupling sid sampling frequency $f_s$ of said digital filter to said line frequency $f_N$.

7. Centralized control receiver according to claim 4, wherein said sampling frequency $f_s$, said constant c, and said phase shift $\phi$ are selected so that the resultant filter coefficient g(k) is one of $-1$, 0, and 1.

8. Centralized control receiver according to claim 4, wherein said filter order N is selected so that zero points result at intervals $\Delta f$ = line frequency $f_N/m$, wherein m is 1, 2, 3, $\ldots$, and said sampling frequency $f_s$ is an integer multiple of said line frequency $f_N$.

9. Centralized control receiver according to claim 4, wherein said filter is a recursive filter.

10. Centralized control receiver according to claim 5, wherein said sampling frequency $f_s$, said constant c, and said phase shift $\phi$ are selected so that the resultant filter coefficient g(k) is one of −1, 0 and 1.

11. Centralized control receiver according to claim 5, wherein said filter order N is selected so that zero points result at intervals $\Delta f =$ line frequency $f_N/m$, wherein m is 1, 2, 3 . . . , and said sampling frequency $f_s$ is an integer multiple of said line frequency $f_N$.

12. Centralized control receiver according to claim 5, wherein said filters is a recursive filter.

* * * * *